United States Patent
Roh et al.

(10) Patent No.: US 9,287,484 B2
(45) Date of Patent: Mar. 15, 2016

(54) THERMOELECTRIC MATERIAL, THERMOELECTRIC ELEMENT, AND MODULE INCLUDING THE SAME, AND PREPARATION METHOD THEREOF

(71) Applicants: Samsung Electronics Co., Ltd., Suwon-si, Gyeonggi-do (KR); Industry-Academic Cooperation Foundation, Yonsei University, Seoul (KR)

(72) Inventors: Jong-wook Roh, Yongin-si (KR); Weon-ho Shin, Basan (KR); Jung-young Cho, Chungcheongnam-do (KR); Kyu-hyoung Lee, Hwaseong-si (KR); Un-yong Jeong, Seoul (KR)

(73) Assignees: SAMSUNG ELECTRONICS CO., LTD. (KR); INDUSTRY-ACADEMIC COOPERATION FOUNDATION, YONSEI UNIVERSITY (KR)

( * ) Notice: Subject to any disclaimer, the term of this patent is extended or adjusted under 35 U.S.C. 154(b) by 22 days.

(21) Appl. No.: 14/078,794

(22) Filed: Nov. 13, 2013

(65) Prior Publication Data
US 2014/0352748 A1 Dec. 4, 2014

(30) Foreign Application Priority Data

May 28, 2013 (KR) .................. 10-2013-0060614

(51) Int. Cl.
*H01L 35/00* (2006.01)
*H01L 35/26* (2006.01)
*B82Y 30/00* (2011.01)
(Continued)

(52) U.S. Cl.
CPC ................ *H01L 35/26* (2013.01); *B82Y 30/00* (2013.01); *C01B 19/007* (2013.01); *H01L 35/16* (2013.01); *C01P 2002/72* (2013.01); *C01P 2002/85* (2013.01); *C01P 2004/04* (2013.01); *C01P 2004/24* (2013.01); *C01P 2004/54* (2013.01); *C01P 2004/62* (2013.01); *C01P 2004/64* (2013.01); *C01P 2006/40* (2013.01)

(58) Field of Classification Search
CPC ..................................................... H01L 35/26
See application file for complete search history.

(56) References Cited

U.S. PATENT DOCUMENTS

| | | | | |
|---|---|---|---|---|
| 8,759,662 | B1 * | 6/2014 | Nolas | 136/238 |
| 2008/0087314 | A1 * | 4/2008 | Xiao et al. | 136/201 |
| 2009/0218551 | A1 * | 9/2009 | Sengupta et al. | 252/512 |

(Continued)

FOREIGN PATENT DOCUMENTS

| | | |
|---|---|---|
| JP | 2008-147625 A | 6/2008 |
| KR | 1020120005630 A | 1/2012 |

(Continued)

OTHER PUBLICATIONS

Kim et al., "Fabrication of bismuth telluride nanoparticles using a chemical synthetic process and their thermoelectric evaluations", Powder Technology, vol. 214, 2011, pp. 463-468.

(Continued)

*Primary Examiner* — Eli Mekhlin
(74) *Attorney, Agent, or Firm* — Cantor Colburn LLP

(57) ABSTRACT

A thermoelectric material including: a two dimensional nanostructure having a core and a shell on the core. Also, a thermoelectric element and a thermoelectric apparatus including the thermoelectric material, and a method of preparing the thermoelectric material.

17 Claims, 15 Drawing Sheets

(51) Int. Cl.
*H01L 35/16* (2006.01)
*C01B 19/00* (2006.01)

(56) References Cited

U.S. PATENT DOCUMENTS

| | | |
|---|---|---|
| 2012/0018681 A1 | 1/2012 | Rowe |
| 2012/0025154 A1 | 2/2012 | Rowe |
| 2012/0111385 A1* | 5/2012 | Ramanath et al. ............ 136/200 |

FOREIGN PATENT DOCUMENTS

| | | |
|---|---|---|
| KR | 1020120064680 A | 6/2012 |
| KR | 1020130010848 A | 1/2013 |
| WO | 2011022189 A2 | 2/2011 |

OTHER PUBLICATIONS

Li et al., "Template Synthesis of Hierarchical Bi2E3 (E=S, Se, Te) Core-Shell Microspheres and Their Electrochemical and Photoresponsive Properties", J. Phys. chem. C., vol. 113, 2009 pp. 18075-18081.

Mehta et al., "Seebeck Tuning in Chalcogenide Nanoplate Assemblies by Nanoscale Heterostructuring", American Chemical Society, vol. 4, No. 9, 2010, pp. 5055-5060.

Li et al., "Thermoelectric properties of hydrothermally synthesized Bi2Te3-xSex Nanocrystals", Scripta Materialia, vol. 67, 2012, ppl 161-164.

Yu et al., "Structural and thermoelectric characterization of high pressure sintered nanocrystalline Bi2Te3 bulks", Materials Research Bulletin, vol. 47, 2012, pp. 1432-1437.

Min et al., "Quick, Controlled Synthesis of Ultrathin Bi2Se3 nanodiscs and Nanosheets", J. Am. Chem. Soc., 2012, 134 (6), pp. 2872-2875.

Mehta et al., "A new class of doped nanobulk high-figure-of-merit thermoelectrics by scalable bottom-up assembly", Nature Materials, vol. 11, Mar. 2012, pp. 233-240.

Min et al., "Surfactant-Free Scalable Synthesis of Bi2Te3 and Bi2Se3 Nanoflakes and Enhanced Thermoelectric Properties of Their Nanocomposites", Advanced Materials, vol. 25, 2013, pp. 1425-1429.

Purkayastha et al., "Surfactant-Directed Synthesis of Branched Bismuth Telluride/Sulfide Core/Shell Nanorods", Advanced Materials, vol. 9999, 2008, p. 1-5.

Soni et al., "Enhanced Thermoelectric Properties of Solution grown Bi2Te3-xSex nanoplatelet Composites", Nano Letters, 2011, pp. 1-7.

Xin et al., "Synthesis and thermoelectric properties of nanostructured bismuth telluride alloys", Acta Phys. Sin., vol. 61, No. 4, 2012, pp. 047201-1-047201-6.

* cited by examiner

THERMOELECTRIC MATERIAL, THERMOELECTRIC ELEMENT, AND MODULE INCLUDING THE SAME, AND PREPARATION METHOD THEREOF

CROSS-REFERENCE TO RELATED APPLICATION

This application claims priority to and the benefit of Korean Patent Application No. 10-2013-0060614, filed on May 28, 2013, and all the benefits accruing therefrom under 35 U.S.C. §119, the content of which is incorporated herein in its entirety by reference.

BACKGROUND

1. Field

The present disclosure relates to a thermoelectric material, a thermoelectric element, a thermoelectric module including the thermoelectric material, and a method of preparing the thermoelectric material.

2. Description of the Related Art

The thermoelectric phenomenon is a reversible, direct energy conversion from heat to electricity and vice versa, which occurs due to movement of electrons and/or holes in a thermoelectric material.

Examples of the thermoelectric phenomenon include the Peltier effect, in which two dissimilar materials are connected and heat is released or absorbed due to a current applied from the outside, the Seebeck effect, in which an electromotive force is generated due to a temperature difference between the ends of the dissimilar materials that are connected, and the Thomson effect, in which heat is released or absorbed when a current is applied to a material having a temperature gradient.

By using the thermoelectric phenomenon, low-temperature waste heat may be directly converted to electricity, and the opposite is also possible. Thus, energy use efficiency may be increased. Also, the thermoelectric phenomenon may be applied in various fields, such as those related to a thermoelectric generator or a thermoelectric cooler.

Energy conversion efficiency of the thermoelectric materials is represented by a dimensionless figure of merit ZT defined by Equation 1:

$$ZT = \frac{S^2 \sigma T}{\kappa} \quad \text{Equation 1}$$

In Equation 1, ZT is a figure of merit, S is a Seebeck coefficient, σ is an electrical conductivity, T is an absolute temperature, and κ is a thermal conductivity.

To increase the energy conversion efficiency, a thermoelectric material having a high Seebeck coefficient, a high electrical conductivity, and a low thermal conductivity is desired, but generally, the Seebeck coefficient, the electrical conductivity, and the thermal conductivity have a trade-off relationship.

Because a nanostructure has a smaller particle size than a bulk material, an intergranular density of the nanostructure increases, which increases the scattering of phonons at an interface of the nanostructure. In this regard, thermal conductivity can be decreased, and the trade-off relationship between the Seebeck coefficient and the electrical conductivity may be destroyed due to the effects of quantum confinement, thereby improving the figure of merit.

Nanostructures are difficult to manufacture, and in bulk have a low figure of merit.

Therefore, there remains a need for a simple manufacturing process which provides a bulk quantity of a nanostructure having an improved figure of merit.

SUMMARY

Provided is a thermoelectric material with a novel structure that provides an improved figure of merit.

Provided is a thermoelectric element including thermoelectric material.

Provided is a thermoelectric module including thermoelectric device.

Provided is a method of preparing thermoelectric material.

Additional aspects will be set forth in part in the description which follows and, in part, will be apparent from the description.

According to an aspect, there is provided a thermoelectric material including a two dimensional nanostructure having a core and a shell on the core.

According to another aspect, there is provided a thermoelectric element including the thermoelectric material.

According to another aspect, there is provided a thermoelectric module including a first electrode; a second electrode; and a thermoelectric element including the thermoelectric material disposed between the first electrode and the second electrode.

According to another aspect, there is provided a method of preparing a thermoelectric material including: treating a first solution including a core precursor of a two dimensional nanostructure at a temperature of 100° C. or higher to form a core seed; reducing the core seed to form a core; adding a shell precursor to a solution including the core to prepare a second solution; and treating the second solution at a temperature of 100° C. or higher to prepare a shell and prepare the two dimensional nanostructure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
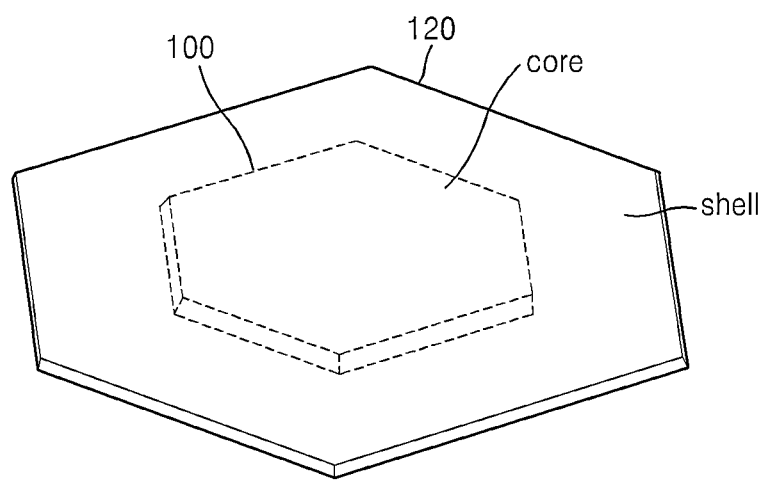
FIG. 1 is a schematic view of an embodiment of a core/shell nanostructure.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. "Or" means "and/or." An expression such as "at least one of," when preceding a list of elements, modifies the entire list of elements and does not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a thermoelectric material according to an exemplary embodiment, a thermoelectric device, and a thermoelectric apparatus including the thermoelectric material, and a method of preparing the thermoelectric material will be disclosed in further detail.

A thermoelectric material according to an embodiment includes a two dimensional ("2D") nanostructure having a core/shell structure. In the core/shell structure, the shell is on the core.

As used herein, the 2D nanostructure is a structure having a cross-sectional length, e.g., a thickness, in a range of about 1 nm to about 200 nm, specifically about 2 nm to about 150 nm, more specifically about 4 nm to about 100 nm, in one or more dimension.

The 2D nanostructure has a selected area, e.g., surface area. The area of the 2D nanostructure is not particularly limited, and may be any suitable area, and may be from several square nanometers ($nm^2$) to several hundreds of square micrometers ($\mu m^2$), e.g., about 3 $nm^2$ to about 900 $\mu m^2$, from several square nanometers ($nm^2$) to several square micrometers ($\mu m^2$), e.g., about 6 $nm^2$ to about 9 $\mu m^2$, or from several nanometer ($nm^2$) to several hundreds of square nanometers ($nm^2$), e.g., about 9 $nm^2$ to about 900 $nm^2$.

Because the 2D nanostructure has a core/shell structure, the nanostructure and an interface between core and shell are simultaneously introduced. Since the 2D nanostructure has dimensions in the nanometer range, scattering of long-wavelength phonons may occur. Further, since a more complex and detailed interfacial structure may be additionally included in the 2D nanostructure, additional scattering of the medium-wavelength phonons may occur. Accordingly, phonons in most wavelength ranges may be scattered to more effectively block thermal transfer by the phonons.

Also, in the 2D nanostructure having the core/shell structure, the composition of the core is different from that of the shell, and thus, a composition ratio of the core and the shell may be selected to provide selective transport of electronic carriers. Hence, the composition ratio of the core and the shell may be selected to select a size of an energy barrier at a core/shell interface. By selecting the size of the energy barrier, electronic carriers having a large contribution to the power factor ($S^2\sigma$) may be selectively transported to improve the Seebeck coefficient, thereby improving the figure of merit.

In the thermoelectric material, the 2D nanostructure may be in the form of a nanoplate, and the 2D nanostructure is not limited to the nanoplate and may have any suitable form that may be used as a 2D nanostructure in the art, such as a nano-disk or a nano-sheet.

A 2D shape of the 2D nanostructure may be any suitable a shape, and may be a circle, oval, triangle, rectangle, pentagon, hexagon, heptagon, octagon, or the like, but the shape is not limited thereto. Any suitable shape that may be used in the art for forming a 2D area may be used.

The 2D nanostructure may have a diameter of about 10 nm to about 1000 nm. For example, the diameter of the 2D nanostructure may be about 10 nm to about 500 nm, a diameter of about 10 nm to about 200 nm, or a diameter of about 10 nm to about 100 nm. The diameter of the 2D nanostructure is not limited thereto and may be suitably selected within a range that may improve the figure of merit. When a distance between opposite ends across a 2D flat surface is irregular, the "diameter" of the 2D nanostructure is an average value of the value of the longest distance and the value of the shortest distance across the 2D nanostructure.

For example, the 2D nanostructure may have a form of a hexagonal facet, and a diameter of the hexagonal facet may be about 10 nm to about 1000 nm.

The 2D nanostructure may have a thickness of about 1 nm to about 100 nm. For example, the 2D nanostructure may have a thickness of about 1 nm to about 80 nm, a thickness of about 1 nm to about 60 nm, a thickness of about 1 nm to about 50, a thickness of about 1 nm to about 40 nm, a thickness of about 1 nm to about 30 nm, a thickness of about 1 nm to about 20 nm, or a thickness less than about 100 nm, but the thickness of the 2D nanostructure is not limited thereto and may be suitably selected within a range that may improve the figure of merit. When a distance between two surfaces of the 2D nanostructure is irregular, the "thickness" of the 2D nanostructure is an average value of the longest distance and the shortest distance in a thickness direction.

For example, the 2D nanostructure may have a thickness of about 1 nm to about 100 nm, and a difference between the largest value and the smallest value of the distance between the two surfaces may be less than about 25%. For example, the 2D nanostructure may have a thickness of about 1 nm to about 100 nm, and a difference between the largest value and the smallest value of the distance between the two surfaces may be less than about 10%.

For example, the 2D nanostructure may have a form of a hexagonal facet, and a thickness of the hexagonal facet may be about 1 nm to about 100 nm.

A ratio of a thickness to a diameter of the 2D nanostructure may be about 1:10 or greater. For example, the ratio of the thickness to the diameter of the 2D nanostructure may be about 1:10 to about 1:500, about 1:10 to about 1:100, or about 1:10 to about 1:50, but the ratio is not limited thereto and may be suitably changed within a range that may improve the figure of merit.

A ratio of a diameter of the core to a diameter of the shell of the 2D nanostructure may be about 1:1.1 to about 1:3. For example, the ratio of the diameter of the core to the diameter of the shell of the 2D nanostructure may be about 1:1.2 to about 1.2, about 1:1.2 to about 1:1.9, or about 1:1.2 to about 1:1.7, but the ratio is not limited thereto and may be suitably selected within a range that may improve the figure of merit.

A ratio of a thickness of the core to a thickness of the shell of the 2D nanostructure may be about 1:1.1 to about 1:3. For example, the ratio of the thickness of the core to the thickness of the shell of the 2D nanostructure may be about 1:1.2 to about 1.2, about 1:1.2 to about 1:1.9, or about 1:1.2 to about 1:1.7, but the ratio is not limited thereto and may be suitably selected within a range that may improve the figure of merit.

Figure 2:
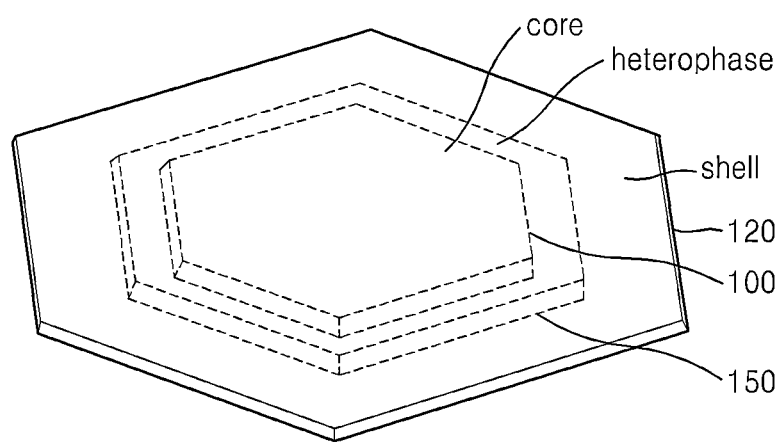
FIG. 2 is a schematic view of another embodiment of a core/shell nanostructure further including a heterophase.

The core and the shell of the 2D nanostructure may have the same form or different forms. For example, the 2D nanostructure may have a structure in which a shell having a hexagonal facet form covers a core having a hexagonal facet form. For example, the 2D nanostructure may have structures shown in FIGS. 1 and 2. In FIGS. 1 and 2, the core 100 is covered by the shell 120 and thus, the core may not be seen in a scanning electron microscopic ("SEM") image but may be seen in a transmission electron microscopic ("TEM") image. Also, the core and the shell may have different forms in the 2D nanostructure. For example, the 2D nanostructure may have a structure in which a shell having a hexagonal facet form covers a core having a circular form. For example, the 2D nanostructure may have a structure in which a shell having a hexagonal facet form covers a core having a triangular facet form.

In the 2D nanostructure, the core and the shell may form an epitaxial junction. When the epitaxial junction is formed at the core/shell interface, scattering of electrons may be inhibited. An epitaxial junction refers to a junction grown wherein the shell and the core grow having the same crystal structure along the same axis of a crystal. Due to the epitaxial growth, the epitaxial junction forms at the core/shell interface. Accordingly, the composition of the crystal changes at the core/shell interface, but the crystal structure does not change, and thus, the scattering of electrons at the interface may be inhibited to improve the figure of merit.

A nanostructure having a different core/shell structure is obtained by simply coating a different shell material on a nanoparticle core, thereby increasing the scattering of electrons at the core/shell interface to decrease the figure of merit. On the contrary, the 2D nanostructure according to the embodiment is formed by directly growing the shell on the core, and more particularly, forming the shell by epitaxial growth, to inhibit the scattering of electrons at the core/shell interface, thereby increasing the figure of merit.

In the 2D nanostructure, the core and the shell may form a single unitary body. Hence, the core and the shell may be chemically bonded, instead of having a simple physical contact therebetween. When the core and the shell form a single body, the scattering of phonons at a chemical bonding surface may be further improved. In the 2D nanostructure, the core and the shell may be connected by a homojunction or a heterojunction. In the 2D nanostructure, the core and the shell may be a homostructure in which the core and the shell have the same chemical composition, or a heterostructure in which the core and the shell have different chemical compositions. The 2D nanostructure may be a single crystal or a polycrystalline.

In the 2D nanostructure of the thermoelectric material, at least one of the core and the shell may include a semiconductor including an element of Group III to Group VI of the Periodic Table of Elements, and the semiconductor may be doped selectively. The semiconductor may include a doped or a non-doped V-VI-type semiconductor or a doped or a non-doped III-V-type semiconductor, for example.

In the thermoelectric material, at least one of the core and the shell of the 2D nanostructure may include a chalcogenide compound. For example, at least one of the core and the shell of the 2D nanostructure may include at least one compound of Formulas 1 to 3.

$Bi_{2-x}Te_{3-y} (0 \leq x < 2, 0 \leq y < 3)$  Formula 1

$Bi_{2-x}Se_{3-y} (0 \leq x < 2, 0 \leq y < 3)$  Formula 2

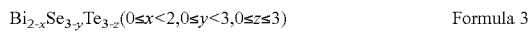

$Bi_{2-x}Se_{3-y}Te_{3-z} (0 \leq x < 2, 0 \leq y < 3, 0 \leq z \leq 3)$  Formula 3

For example, the core and the shell of the 2D nanostructure may be each independently comprise a compound of Formulas 1 to 3 above.

The 2D nanostructure may further include a heterophase 150 between the core and the shell. For example, the 2D nanostructure may further include a heterophase as shown in FIG. 2. The heterophase may be formed during a process in which a portion of the elements forming the core are substituted with the elements forming the shell, during the process of forming the shell on the core.

For example, in the 2D nanostructure, when the core includes the compound of Formula 2 above, and the shell includes the compound of Formula 1 above, the heterophase may include the compound of Formula 3 below.

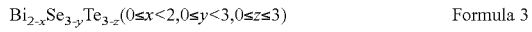

$Bi_{2-x}Se_{3-y}Te_{3-z} (0 \leq x < 2, 0 \leq y < 3, 0 \leq z \leq 3)$  Formula 3

The thermoelectric material may include a bulk material comprising the 2D nanostructure. The thermoelectric material may be a nanobulk material that retains a structural characteristics of the 2D nanostructure in a bulk form. The nanobulk thermoelectric material may be pressure-sintered, that is prepared by pressuring and sintering the 2D nanostructure powder.

The nanobulk thermoelectric material may be pressure-sintered by various methods. For example, the 2D nanostructure powder may be disposed into a mold with a selected shape, and may be molded by using a hot press method, for example, at a high temperature of about 300° C. to about 800° C. and a high pressure, for example, about 30 megaPascals (MPa) to about 300 MPa. For example, the nanobulk thermoelectric material may be manufactured by using a spark plasma sintering method including sintering the 2D nanostructure powder in a short period of time by applying a high voltage current under a high pressure condition, for example a current of about 50 amperes (A) to about 500 A under a pressure condition of about 30 MPa to about 300 MPa. For example, the nanobulk thermoelectric material may be manufactured by a hot forging method, which involves pressure-sintering the 2D nanostructure powder at a high temperature of, for example, about 300° C. to about 700° C. while pressure-molding the 2D nanostructure powder.

Due to the pressure-sintering processes, the thermoelectric material may have a density of about 70% to about 100% of a theoretical density. The theoretical density is calculated by dividing a molecular weight of the thermoelectric material by an atomic volume thereof, and the theoretical density may be evaluated by a lattice constant. For example, the thermoelectric material may have a density of about 95% to about 100%, and may correspondingly have a higher electrical conductivity.

Since the nanobulk thermoelectric material may be manufactured in various forms, a thin and high efficiency thermoelectric device with a thickness of 1 millimeter (mm) or less may be manufactured. The thermoelectric material may be easily manufactured in bulk, unlike conventional nanostructures, provide an improved figure of merit in a bulk form, and thus, may have improved industrial applicability.

The thermoelectric material may further include another nanostructure in addition to the 2D nanostructure. For example, the thermoelectric material may further include at least one 1D and/or 2D nanostructure without the core/shell structure, which may comprise a nanoplate, nanodisk, nanosheet, nanowire, nanofiber, nanobelt, nanotube, nanocrystal, or nanopowder.

The thermoelectric material may form a composite by further including, in addition to the 2D nanostructure, a bulk thermoelectric material matrix that is electrochemically inactive with respect to the 2D nanostructure. For example, the composite may have a structure in which the 2D nanostructure is introduced to an interface of crystals or within the crystalline structure of a bulk crystalline thermoelectric material matrix.

The bulk thermoelectric material matrix is not particularly limited and may comprise any suitable thermoelectric material that does not react with the 2D nanostructure. For example, the bulk thermoelectric material matrix may have a suitable crystallinity and may include at least one element of bismuth (Bi), antimony (Sb), tellurium (Te), or selenium (Se). For example, a formula of the thermoelectric material matrix may be $A_2M_3$ (wherein, A is Bi and/or Sb, and M is Te and/or Se). For example, when a Bi—Te based thermoelectric material is used, a thermoelectric performance at around room temperature may be excellent.

A thermoelectric element according to another embodiment may include a thermoelectric material including the 2D nanostructure described above. The thermoelectric element may be a p-type thermoelectric element or an n-type thermoelectric element. The thermoelectric element may be a thermoelectric material formed in a selected shape, for example, in a rectangular parallelepiped shape.

In addition, the thermoelectric device may couple to an electrode and may generate a cooling effect when a current is applied thereto, and may generate power using the temperature difference.

A thermoelectric module according to another embodiment includes a first electrode, a second electrode, and a thermoelectric element including a thermoelectric material that is interposed between the first and second electrodes, wherein the thermoelectric material includes the 2D nanostructure.

For example, when there is a temperature difference between the first electrode and the second electrode, the thermoelectric module may be implemented to generate a current through the thermoelectric element. In the thermoelectric module, the thermoelectric element includes the thermoelectric material including the 2D nanostructure, a first end of the thermoelectric element is in contact with the first electrode, and a second end of the thermoelectric element is in contact with the second electrode. When a temperature of the first electrode is increased to a temperature higher than a temperature of the second electrode, or when a temperature of the second electrode is decreased to a temperature lower than a temperature of the first electrode, a current that flows from the first electrode to the thermoelectric element and passes through the thermoelectric element to flow into the second electrode may be generated. While the thermoelectric module is being operated, the first electrode and the second electrode may be electrically connected.

Moreover, the thermoelectric module may further include a third electrode and may further include a thermoelectric element that is disposed between the first electrode and the third electrode.

For example, the thermoelectric module may include the first electrode, the second electrode, the third electrode, the p-type thermoelectric element having a first end and a second end, and the n-type thermoelectric element having a first end and a second end, wherein the first end of the p-type thermoelectric element is in contact with the first electrode, the second end of the p-type thermoelectric element is in contact with the third electrode, the first end of the n-type thermoelectric element is in contact with the first electrode, and the second end of the p-type thermoelectric element is in contact with the second electrode. Thus, when a temperature of the first electrode is higher than that of the second electrode and the third electrode, a current that flows from the second electrode to the n-type thermoelectric element, to the first electrode through the n-type thermoelectric element, to the p-type nanostructure through the first electrode, and to the third electrode through the p-type nanostructure may be generated. The second electrode and the third electrode may be electrically connected while the thermoelectric module is being operated. At least one of the p-type thermoelectric element and the n-type thermoelectric element includes the thermoelectric material that includes the 2D nanostructure.

The thermoelectric module may further include an insulating substrate on which at least one of the first electrode, the second electrode, and optionally the third electrode is disposed.

The insulating substrate may comprise gallium arsenic (GaAs), sapphire, silicon, Pyrex, or a quartz substrate. The electrode may be variously selected from aluminum, nickel, gold, and titanium, and may also have any suitable size. The electrode may be patterned by using any suitable known patterning method, such as a lift-off semiconductor process, a deposition method, or a photolithography method.

Figure 8:
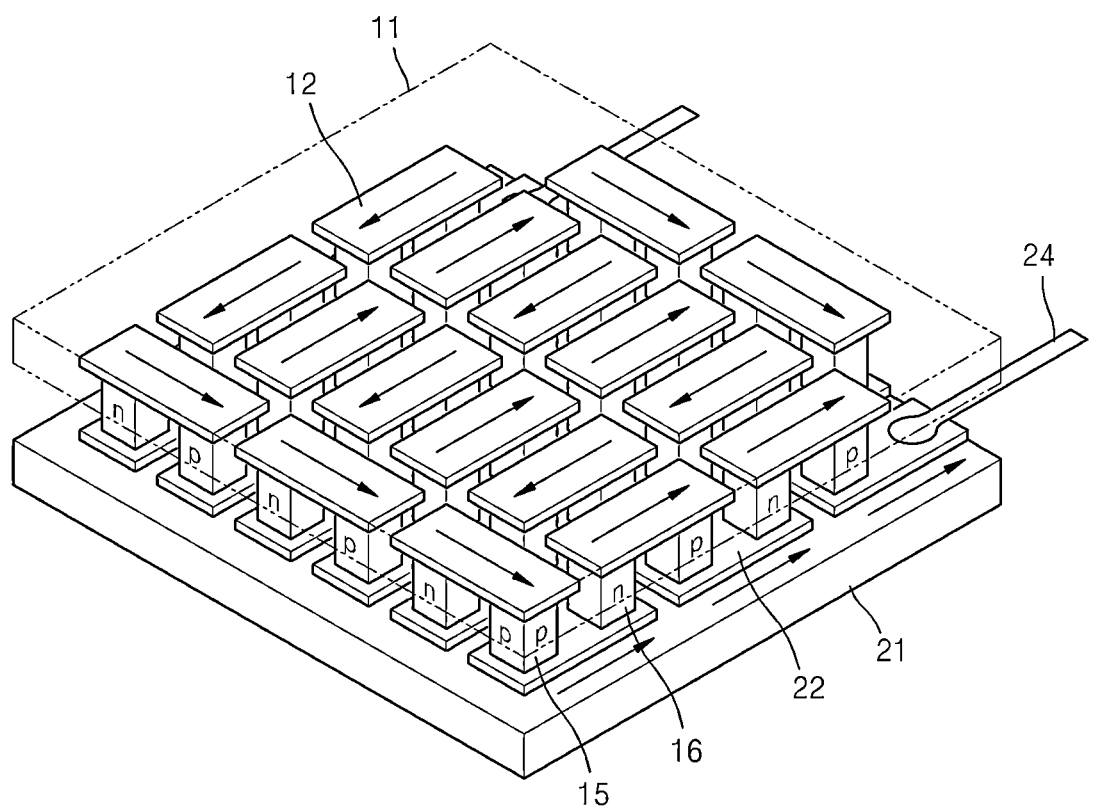
FIG. 8 is a schematic view an embodiment of a thermoelectric module.

FIG. 8 is an example of an embodiment of the thermoelectric module including the thermoelectric element. As shown in FIG. 8, a top electrode 12 and a bottom electrode 22 are patterned on a top insulating substrate 11 and a bottom insulating substrate 21, respectively. The top electrode 12 and the bottom electrode 22 contact a p-type thermoelectric element 15 and an n-type thermoelectric element 16, respectively. The top electrode 12 and the bottom electrode 22 are connected to the outside of the thermoelectric element by a lead electrode 24.

In the thermoelectric module, the p-type thermoelectric element 15 and the n-type thermoelectric element 16 may be alternately aligned as shown in FIG. 8, and at least one of the p-type thermoelectric element 15 and the n-type thermoelectric element 16 may include the thermoelectric material including the 2D nanostructure.

In the thermoelectric module, one of the first electrode and the second electrode may be electrically connected to a power source. A temperature difference between the first electrode and the second electrode may be 1 degree or greater, 5 degrees or greater, 50 degrees or greater, 100 degrees or greater, or 200 degrees or greater. A temperature of each of the first electrode and the second electrode may be any temperature as long as the temperature does not cause melting of elements or current interference in the thermoelectric module.

Figure 9:
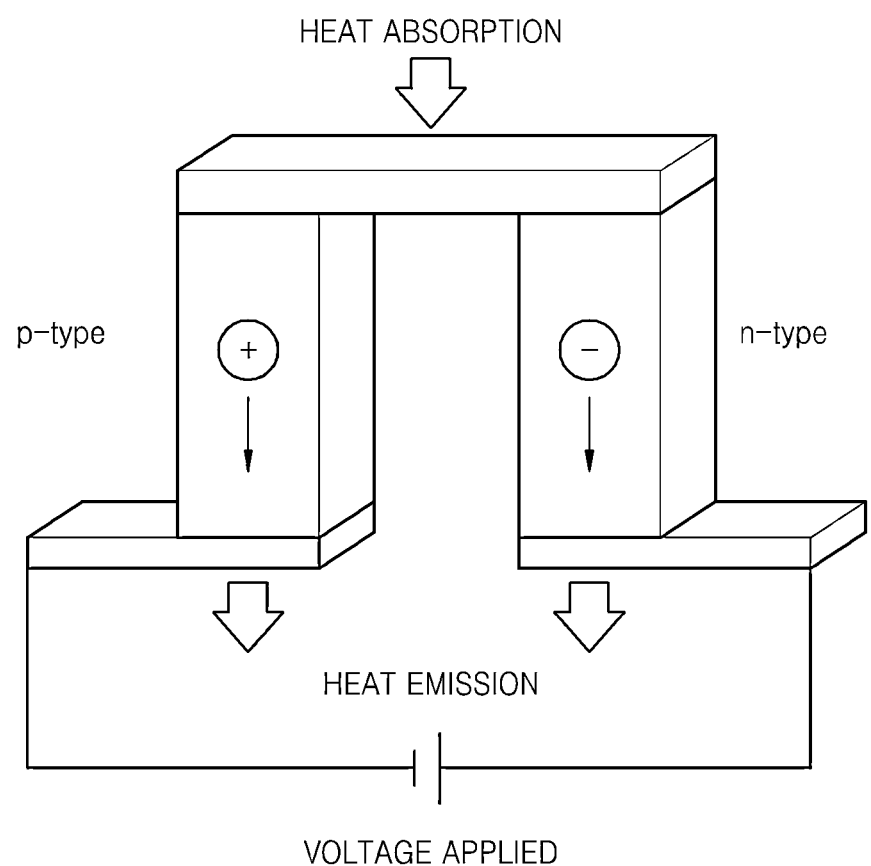
FIG. 9 is a schematic view of an embodiment of a thermoelectric cooler.
Figure 10:
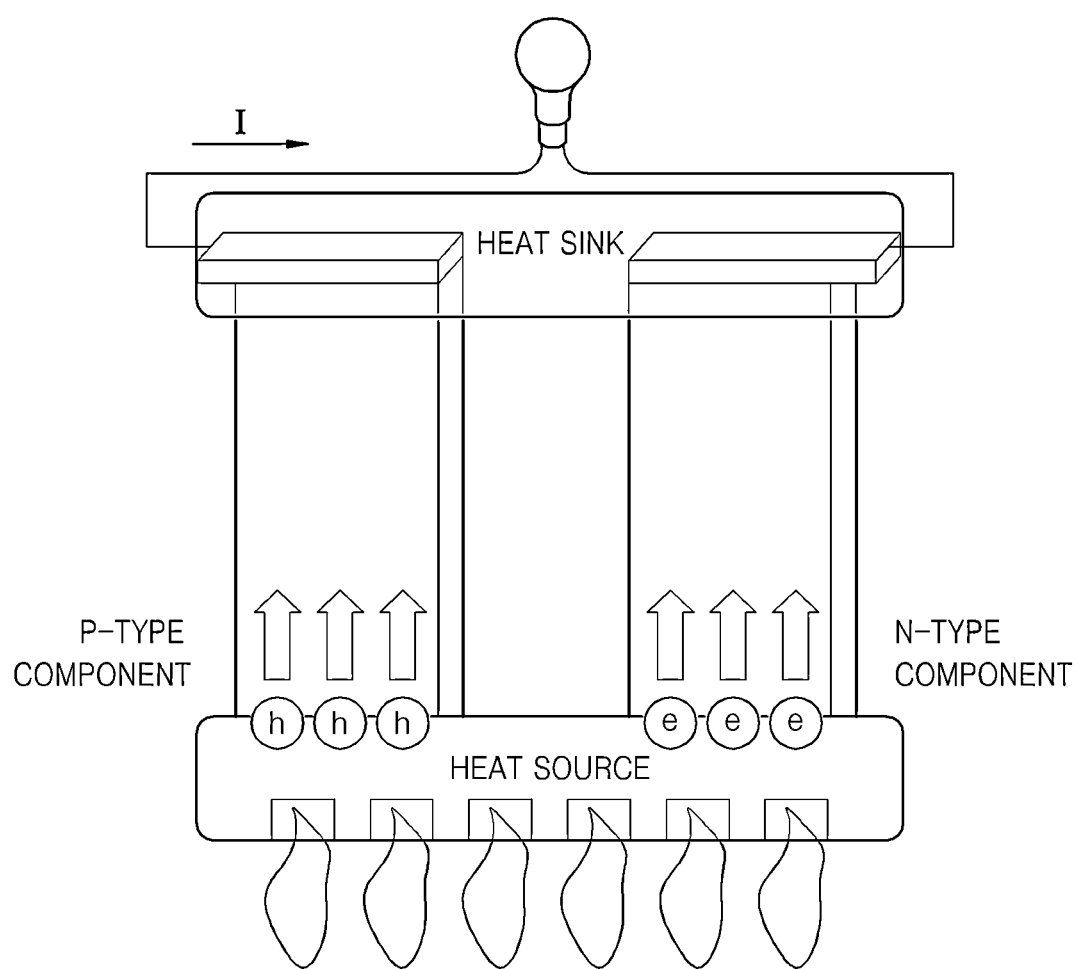
FIG. 10 is a schematic view of an embodiment of a thermoelectric generator.

In the thermoelectric module, one of the first electrode, the second electrode, and optionally the third electrode may be electrically connected to a power source as shown in FIG. 9, or to the outside of the thermoelectric module, for example, as in an electric element (e.g., a battery) that consumes or stores power as shown in FIG. 10.

The thermoelectric module may be contained in a thermoelectric apparatus such as a thermoelectric generator, a thermoelectric cooler, or a thermoelectric sensor, but is not limited thereto, and any apparatus that may directly convert heat and electricity may be used. Additional details of the structure and manufacturing method of the thermoelectric cooling system are known in the art and can be determined by one of skill in the art without undue experimentation, and thus will not be described in further detail herein.

A method of preparing a thermoelectric material according to another embodiment includes treating, e.g., stirring, a first solution including a core precursor of the 2D nanostructure at a high temperature of 100° C. or higher to form a core seed; reducing the core seed to form a core; adding the shell precursor to a solution including the core to prepare the second solution; and treating, e.g., stirring, the second solution at a high temperature of 100° C. or higher to prepare a shell of the 2D nanostructure.

Figure 5A:
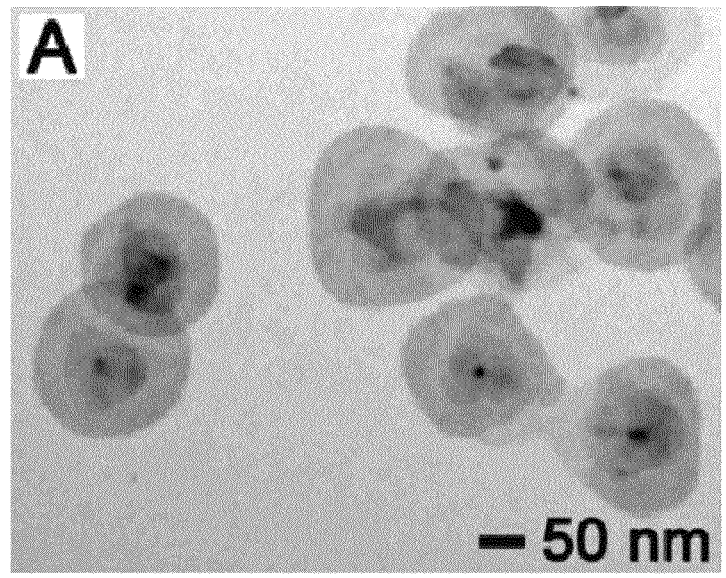
FIGS. 5A to 5D are TEM images of the core/shell 2D nanostructure measured at each step of the manufacturing process in Example 1.
Figure 5B:
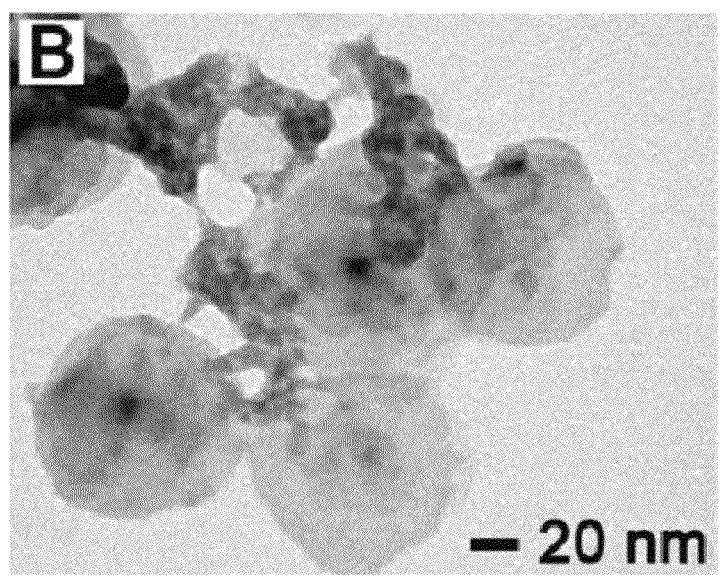
Figure 5C:
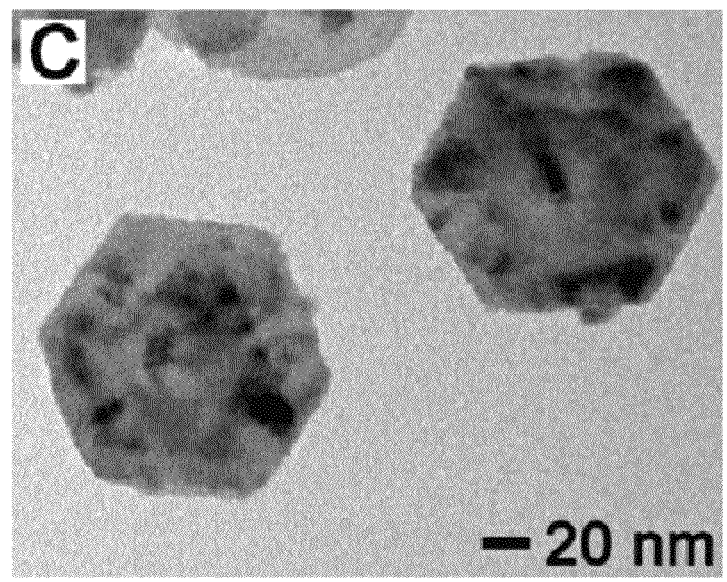
Figure 5D:
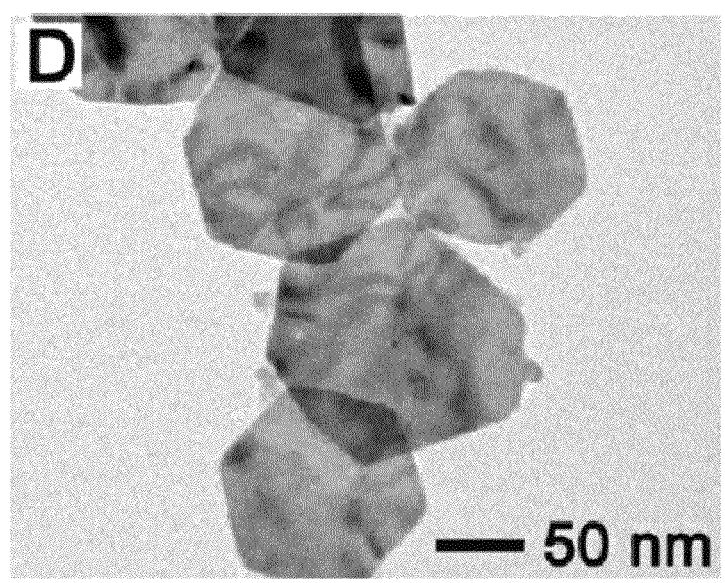
Figure 5E:
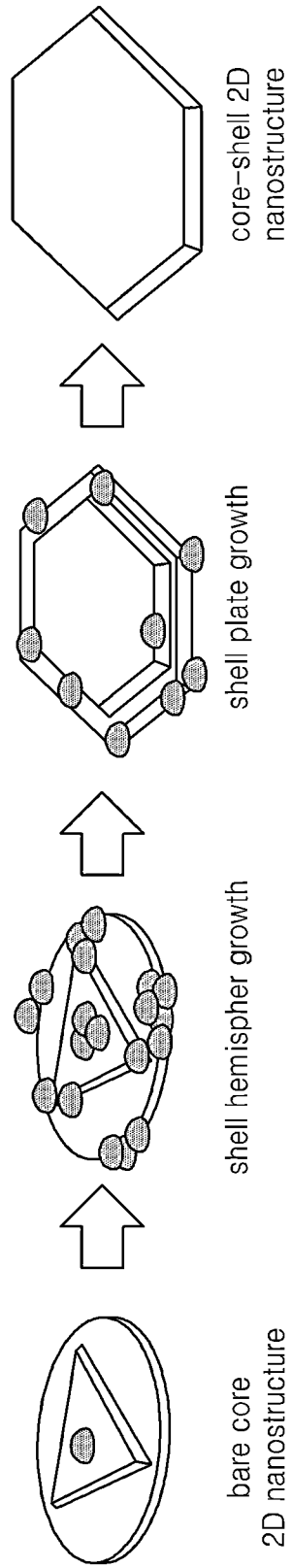
FIG. 5E is a schematic view of an embodiment of a growth mechanism of the core/shell 2D nanostructure manufactured in Example 1.

For example, as shown in FIG. 5E, after a core seed is reduced in a first solution to form a core, which may be in the form of a nanoplate, a second solution is prepared by adding a shell precursor to a solution including the core nanoplate, and then the second solution may be stirred at a high temperature of 100° C. or higher to form the shell.

In the preparation method, each of the core precursor and the shell precursor may be a compound including an element forming a 2D nanostructure having the core/shell structure. For example, each of the core precursor and the shell precursor may be an oxide, hydroxide, nitrogen oxide, or chloride of Groups III to VI of the Periodic Table of Elements, but they are not limited thereto, and any suitable precursor known in the art may be used. For example, each of the core precursor and the shell precursor may be a precursor compound of an element including Bi, Sb, Te, or Se. For example, each of the core precursor and the shell precursor may be $BiCl_4$, $Bi(NO_3)_3 \cdot 5H_2O$, $Na_2TeO_3$, $Na_2SeO_3$, or $Se(OH)_6$.

In the preparation method, a solvent of the first solution and the second solution may be at least one of ethylene glycol, propylene glycol, cysteine, aqueous ammonia, deionized water, oleylamine, or monoethanolamine, but is not limited thereto, and any suitable known solvent in the art suitable for preparing the 2D nanostructure may be used.

In the preparation method, the reducing agent may be at least one of hydroxylamine ($NH_2OH$), thioglycolic acid, cysteine, ammonia, or monoethanolamine, but is not limited thereto, and any suitable known reducing agent in the art suitable for preparing the 2D nanostructure may be used.

In the preparation method, the temperature of the first solution and the second solution may be 100° C. or higher, but is not limited thereto, and any temperature condition that allows a 2D nanostructure to be prepared may be used. For example, the temperature of the first solution and the temperature of the second solution may each be in a range of about 100° C. to about 300° C., in a range of about 120° C. to about 250° C., or in a range of about 120° C. to about 230° C.

In the preparation method, the 2D nanostructure may be prepared without including a surfactant, and thus contamination by a surfactant during a sintering process may be prevented. Accordingly, a thermoelectric material with improved electrical conductivity may be prepared.

However, if desired, the solution may additionally include a surfactant in the preparation method. The surfactant used in the preparation method is not particularly limited, and any known surfactant in the art suitable for preparing the 2D nanostructure may be used. For example, the surfactant may be polyvinyl pyrrolidone ("PVP"), sodium dodecyl benzene sulfonate ("SDBS"), polyvinyl alcohol ("PVA"), or Triton-X100.

An embodiment will be disclosed in further detail with reference to the following Examples and Comparative Examples. These Examples are for illustrative purposes only and shall not limit the scope of this disclosure.

EXAMPLES

Preparation of a 2D Nanostructure Powder

Example 1

Preparation $Bi_2Se_3$(Core)/$Bi_2Te_3$(Shell) 2D Nanostructure Powder (BS:BT=1:1)

45 milliliters (mL) of ethyleneglycol was added to a round-bottom flask, and a mixture solution of a solution including 0.242 grams (g) of $Na_2SeO_3$ dissolved in 45 mL of ethyleneglycol and a solution including 0.678 g of $Bi(NO_3)_3 \cdot 5H_2O$ dissolved in 15 mL of ethyleneglycol was added to the flask. Then, a solution in which 1.0 g of polyvinyl pyrrolidone was dissolved in 40 mL of ethylene glycol was added therein. The mixture was stirred using a magnetic stirrer at room temperature, and then the temperature of the flask was increased to 180° C. in a nitrogen atmosphere. As a color of the mixture changed from transparent to white and then finally to dark blue, the reaction was completed, and a $Bi_2Se_3$ single crystalline seed was formed. Then, a solution including 2.4 mL of $NH_2OH$ as a reducing agent dissolved in 10 mL of ethylene glycol was added to the flask, and as a color of the mixture changed to dark purple, a $Bi_2Se_3$ core plate was formed. In order to complete a reaction of the precursor used above, the mixture was maintained at a temperature of 180° C. while stirring using the magnetic stirrer for about 90 minutes in a nitrogen atmosphere.

In a solution including the core plate, a mixture solution of a solution in which 0.465 g of $Na_2TeO_3$ was dissolved in 45 mL of ethylene glycol and a solution in which 0.678 g of $Bi(NO_3)_3 \cdot 5H_2O$ was dissolved in 15 mL of ethylene glycol was added. Then, a solution in which 2.4 mL of $NH_2OH$, which is a reducing agent, was dissolved in 5 mL of ethylene glycol was added. A solution obtained therefrom was stirred using the magnetic stirrer while increasing a temperature of the flask up to 160° C. in a nitrogen atmosphere, stirred for 24 hours, and then leave the solution alone for a certain amount of time to form a shell.

After 10 minutes from completing a shell forming reaction, the flask was cooled to room temperature in a nitrogen atmosphere to prevent oxidation. A solution obtained therefrom was centrifuged at 12000 rpm for 10 minutes, and then the precipitate was washed three times with a mixture solution of 300 mL of acetone and 60 mL of water to finally obtain a nanoplate powder having a $Bi_2Se_3$ core/$Bi_2Te_3$ shell structure.

Also, $Bi_2Se_2Te$, which is a heterophase, was formed between the core and the shell.

In the core/shell nanoplate, a diameter of the $Bi_2Te_3$ shell was about 100 nm and a thickness was about 5 nm.

In the core/shell nanoplate, a diameter of the $Bi_2Se_3$ core nanoplate was about 80 nm and a thickness was less than 5 nm.

Figure 3A:
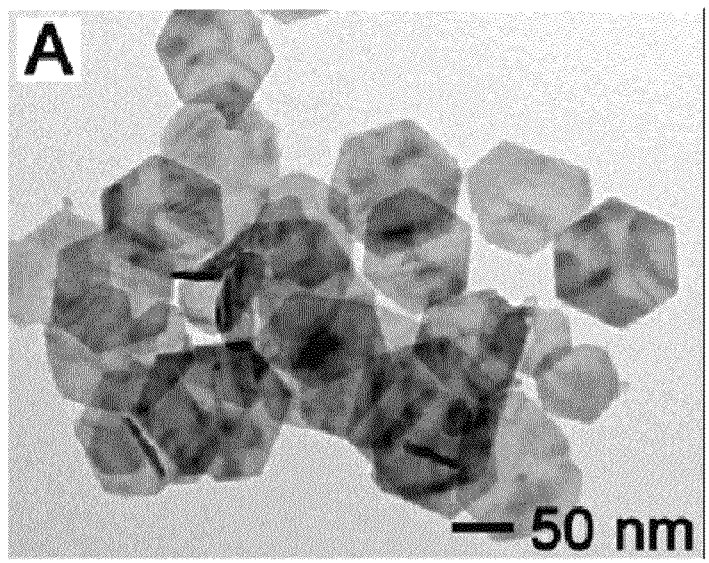
FIG. 3A is a transmission electron microscopic ("TEM") image of the core/shell 2D nanostructure manufactured in Example 1.
Figure 3B:
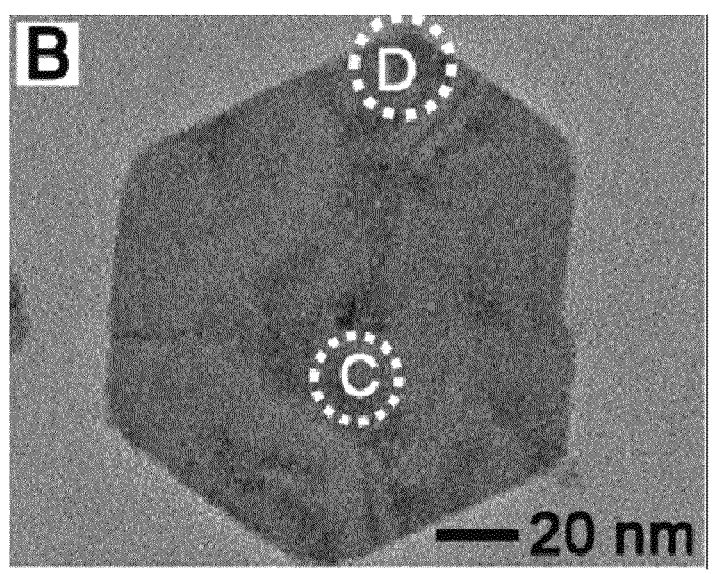
FIG. 3B is a magnified view of FIG. 3A.
Figure 3C:
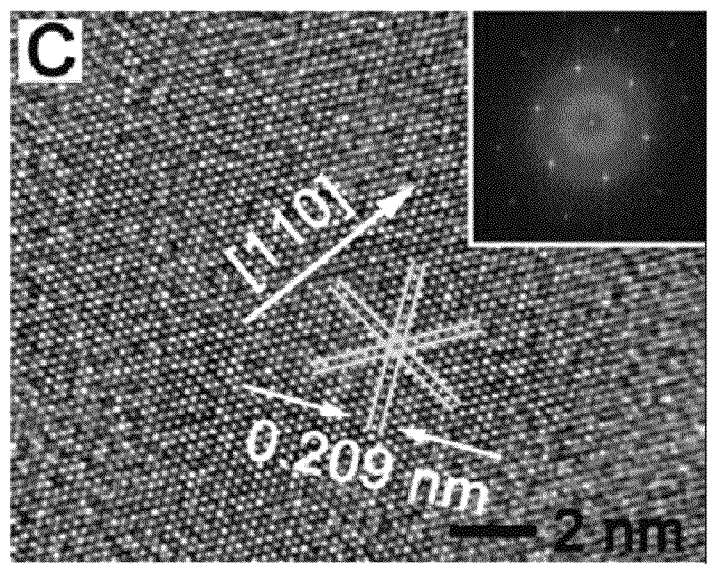
FIG. 3C is a magnified view of area C in FIG. 3B.
Figure 3D:
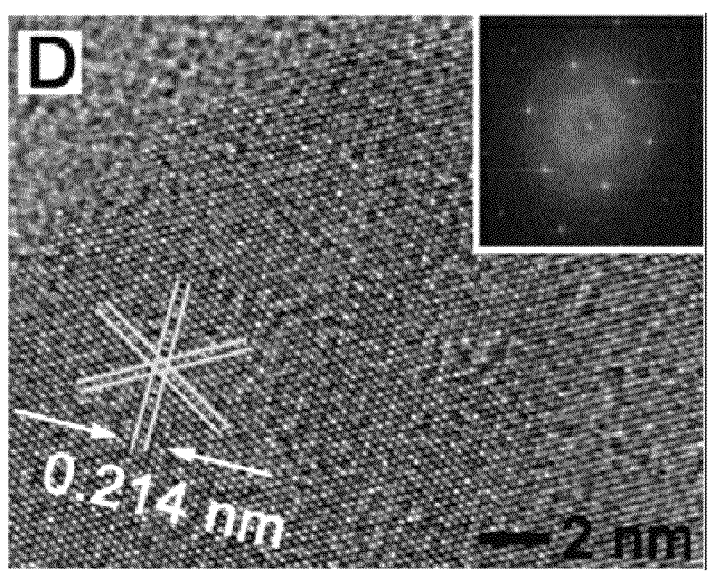
FIG. 3D is a magnified view of area D in FIG. 3B.

TEM images of the prepared core/shell nanoplate are shown in FIGS. 3A to 3D. As shown in FIGS. 3A and 3B, a nanoplate having a hexagonal facet was obtained. Areas C and D of FIG. 3B were magnified at 110× and a interlayer distance (d spacing) between adjacent crystal lattice plane (110) was measured to obtain 0.209 nm corresponding to $Bi_2Se_2Te$ at area C and 0.214 nm corresponding to $Bi_2Te_3$ at area D (0.214 nm was probably obtained due to 4.6% of lattice mismatch from 0.219 nm). Accordingly, the presence of heterophase was confirmed.

Figure 4A:
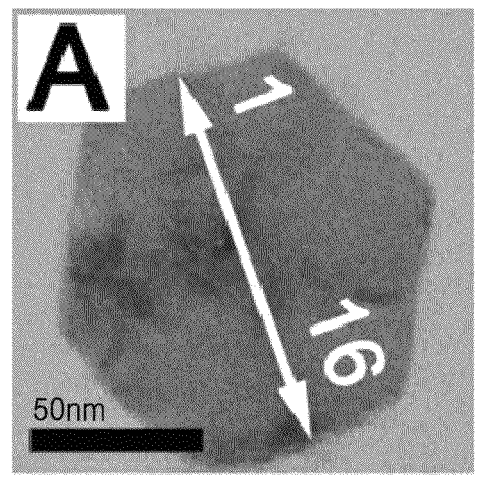
FIG. 4A is a TEM image of the core/shell 2D nanostructure manufactured in Example 1.
Figure 4B:
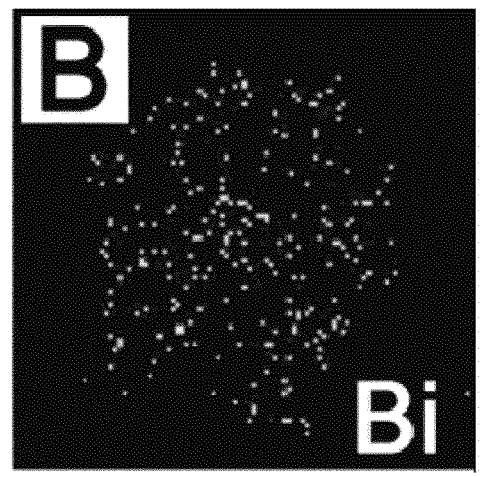
FIGS. 4B to 4D are TEM-EDX mapping images of the core/shell 2D nanostructure shown in FIG. 4A.
Figure 4C:
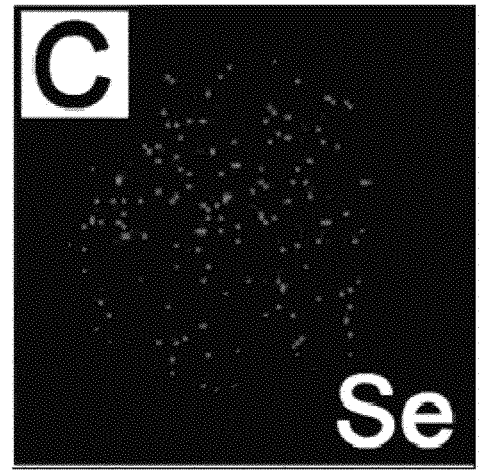
Figure 4D:
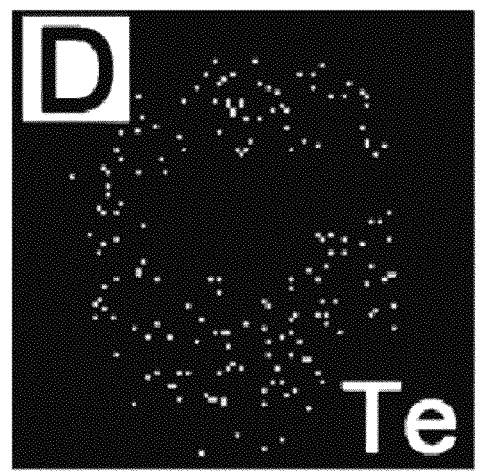
Figure 4E:
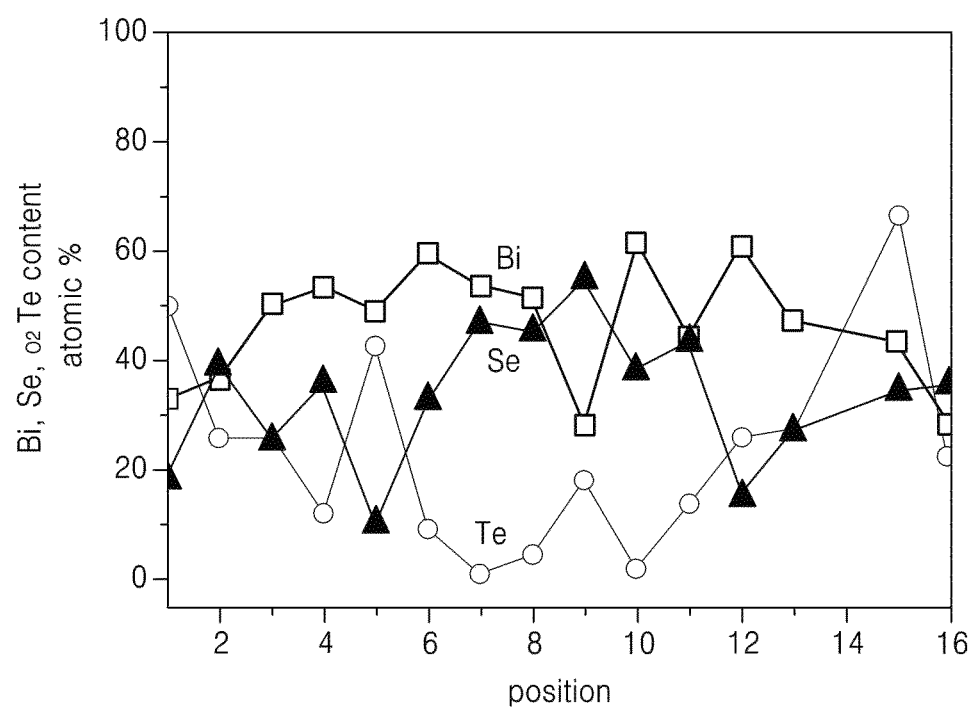
FIG. 4E is a graph of Bi, Se, or Te content (atomic percent, atomic %) versus position showing the content of Bi, Se, and Te measured by X-ray photoelectron spectroscopy ("XPS") at each position of the core/shell 2D nanostructure shown in FIG. 4A from position 1 to position 16.

Also, results of TEM-EDX mapping of the core/shell nanoplate are shown in FIGS. 4A to 4E. As shown in FIG. 4B, Bi was uniformly distributed in the entire core/shell nanoplate. As shown in FIG. 4C, Se was primarily distributed around the core area of the nanoplate. As shown in FIG. 4D, Te was primarily distributed around the shell area of the nanoplate. As shown in FIG. 4E, the presence of Bi, Se, and Te in the nanoplate was confirmed.

Figure 6A:
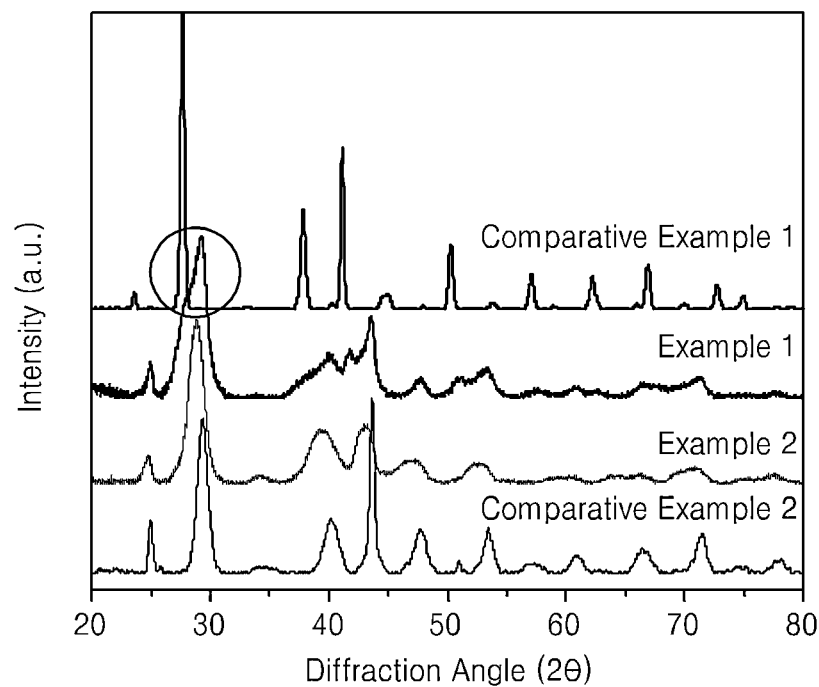
FIG. 6A is a graph of intensity (arbitrary units, a.u.) versus diffraction angle (degrees two-theta, 2θ) which shows X-ray diffraction spectra of the nanoplate powders prepared in Example 1, Example 2, Comparative Example 1, and Comparative Example 2.
Figure 6B:
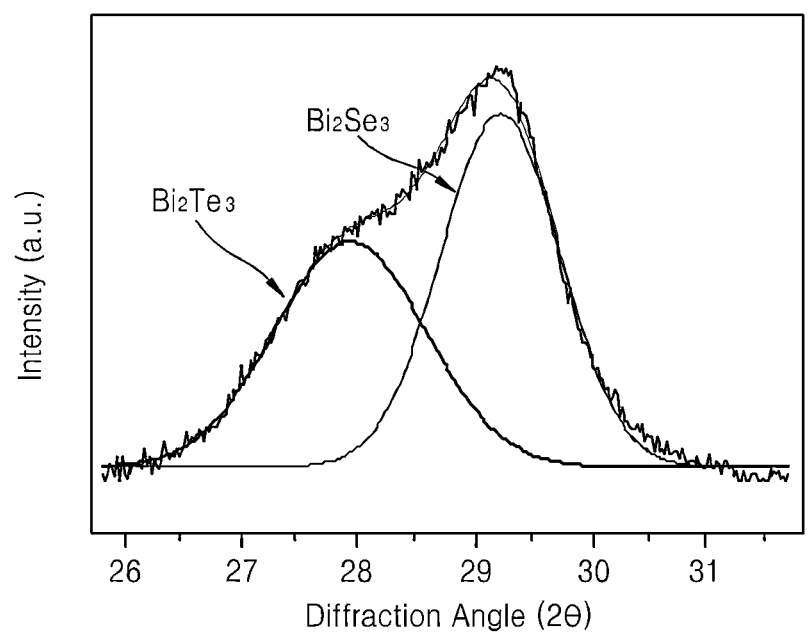
FIG. 6B is a magnified view of the circled area in FIG. 6A.

Also, as a result of analyzing XRD spectrum of the core/shell nanoplate, peaks that match a composite peak corresponding to $Bi_2Se_3$ and a peak corresponding to $Bi_2Te_3$ were obtained as shown in FIGS. 6A and 6B. Accordingly, it was confirmed that $Bi_2Se_3$ (core) and $Bi_2Te_3$ (shell) were obtained.

Example 2

$Bi_2Se_3$(Core)/$Bi_2Se_2Te$(Shell) 2D Nanostructure Powder (BS:BT=2:1)

A core/shell 2D nanostructure was prepared in the same manner as in Example 1, except for changing the amount of $Na_2SeO_3$ added to the solution used in preparing the core plate from 0.456 g to 0.930 g, changing the amount of $Bi(NO_3)_3 \cdot 5H2O$ from 0.678 g to 1.356 g, and changing a molar ratio of $Bi_2Se_3$ to $Bi_2Te_3$ to 2:1.

A nanoplate powder having a structure of $Bi_2Se_3$ (core)/$Bi_2Se_2Te$ (shell) was obtained. An XRD spectrum corresponding to the powder is shown in FIG. 6A.

Comparative Example 1

Preparation of $Bi_2Te_3$ Nanoplate

A $Bi_2Te_3$ nanoplate powder was prepared by using the method disclosed in *J. Am. Chem. Soc.*, 2012, 134 (6), pp 2872-2875, the content of which is incorporated herein by reference in its entirety.

Comparative Example 2

Preparation of $Bi_2Se_3$ Nanoplate Powder

A $Bi_2Se_3$ nanoplate powder was prepared by using the method disclosed in *J. Am. Chem. Soc.*, 2012, 134 (6), pp. 2872-2875, the content of which is incorporated herein by reference in its entirety.

Preparation of Bulk 2D Nanostructure

Example 3

Preparation of Bulk $Bi_2Se_3$(Core)/$Bi_2Te_3$(Shell) 2D Nanostructure

The nanostructure powder prepared in Example 1 was added to a mold formed of graphite, and the nanostructure was pressure-sintered with a spark plasma sintering in a vacuum of $10^{-2}$ torr or less at a pressure of 500 MPa and at a temperature of 220° C. for 3 minutes to prepare a nanobulk $Bi_2Se_3$(core)/$Bi_2Te_3$(shell) 2D nanostructure.

As a nanostructure of the thermoelectric material is retained in the bulk, scattering of phonons increases, and thus the thermoelectric material may have a structure similar to a type of phonon glass electron crystal (PGEC) through which electrons may easily pass.

Comparative Example 3

Preparation of a Bulk $Bi_2Te_3$ Nanoplate

A bulk nanoplate was prepared in the same manner as in Example 3, except that the nanostructure powder prepared in Comparative Example 1 was used instead of the nanostructure powder prepared in Example 1.

Comparative Example 4

Preparation of Bulk $Bi_2Se_3$ Nanoplate

A bulk nanoplate was prepared in the same manner as in Example 3, except that the nanostructure powder prepared in Comparative Example 2 was used instead of the nanostructure powder prepared in Example 1.

Evaluation Example 1

Figure 7A:
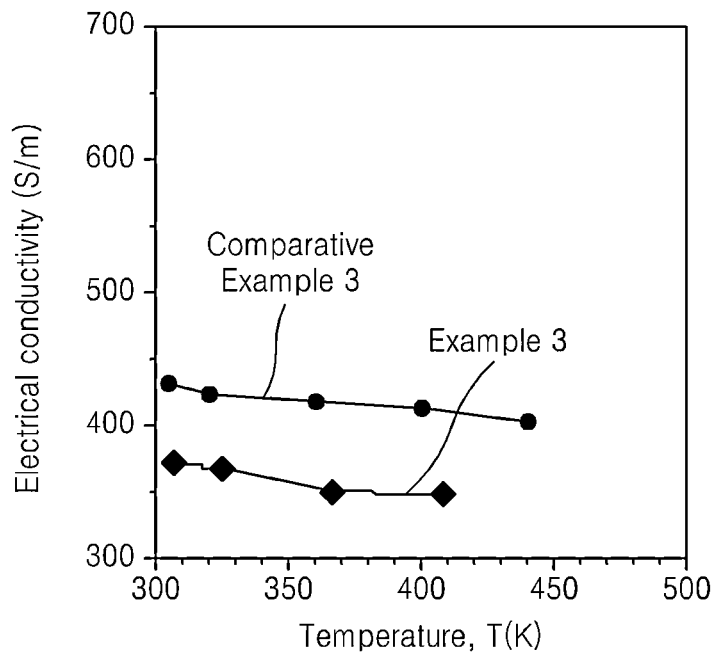
FIG. 7A is a graph of electrical conductivity (Siemens per centimeter, S/cm) versus temperature (Kelvin, K) and showing the electrical conductivity of the thermoelectric materials prepared in Example 3 and Comparative Example 3.
Figure 7B:
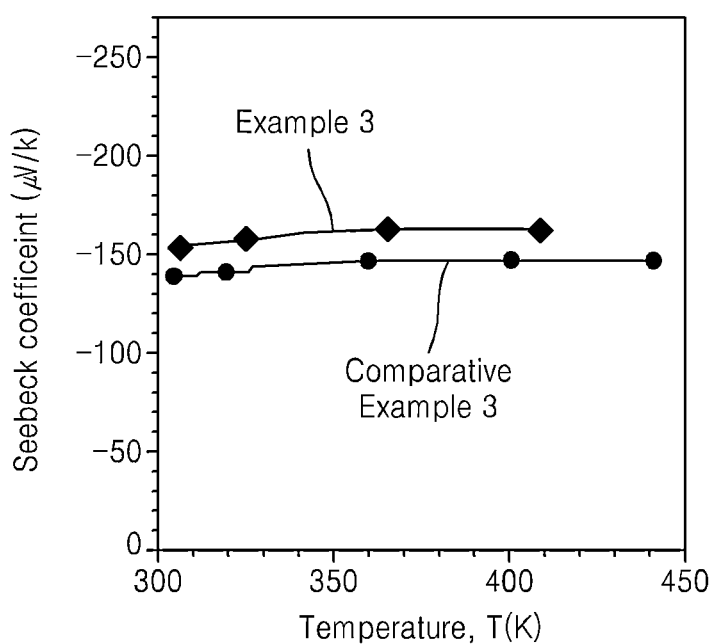
FIG. 7B is a graph of Seebeck coefficient (microvolts per Kelvin, μV/K) versus temperature (K) showing Seebeck coefficients of the thermoelectric materials prepared in Example 3 and Comparative Example 3.

Electrical conductivities and Seebeck coefficients of the thermoelectric materials prepared in Example 3 and Comparative Examples 3 and 4 were simultaneously measured by using ZEM-3 manufactured by ULVAC-RIKO, and parts of the results are shown in FIGS. 7A and 7B respectively.

Figure 7C:
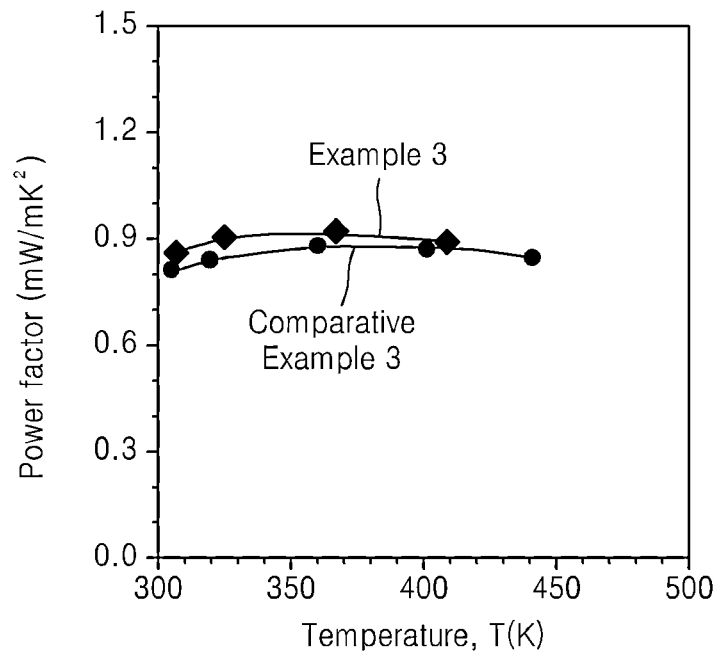
FIG. 7C is a graph of power factor (milliwatts per meter-Kelvin$^2$, mW/mK$^2$) versus temperature (K) showing power factors of the thermoelectric materials prepared in Example 3 and Comparative Example 3.
Figure 7D:
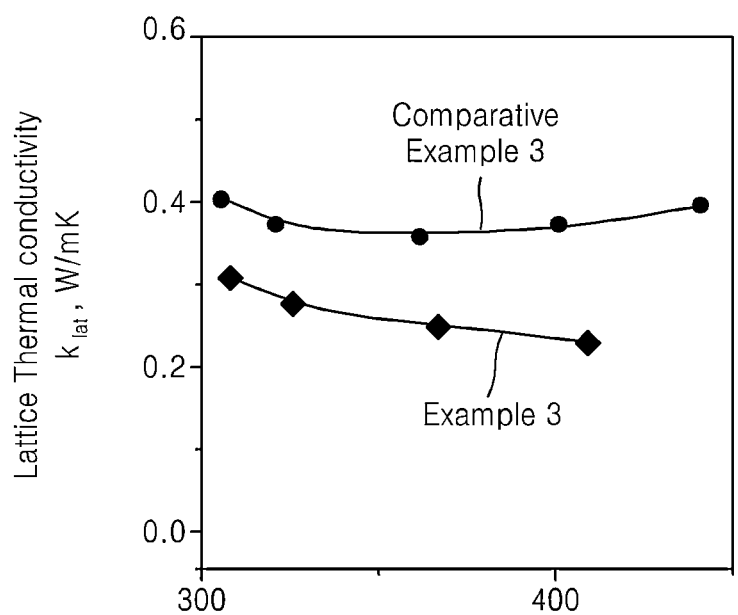
FIG. 7D is a graph of lattice thermal conductivity (Watts per meter-Kelvin, W/mK) versus temperature showing a lattice thermal conductivity of the thermoelectric materials prepared in Example 3 and Comparative Example 3.
Figure 7E:
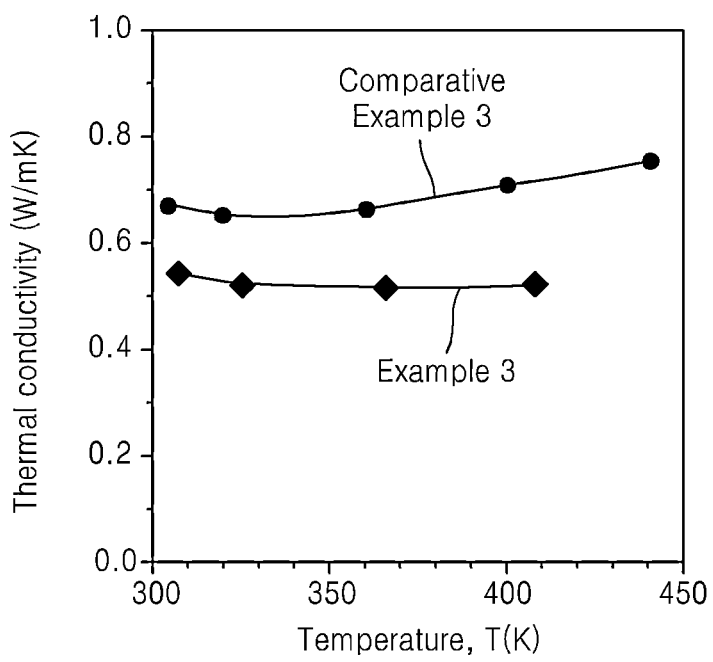
FIG. 7E is a graph of thermal conductivity (Watts per meter-Kelvin, W/mK) versus temperature (K) showing thermal conductivity of the thermoelectric materials prepared in Example 3 and Comparative Example 3.

The thermal conductivities of the thermoelectric materials prepared in Example 3 and Comparative Example 3 were calculated from thermal diffusivity measured by using a ULVAC TC-9000H (a laser flash method), and are illustrated in FIG. 7E. The lattice thermal conductivities ($k_{lat}$, W/mK) were calculated with an assumption of a Lorentz constant ($L=2\times10^{-8}$ WOhm $K^{-2}$), and the results are shown in FIG. 7D.

Figure 7F:
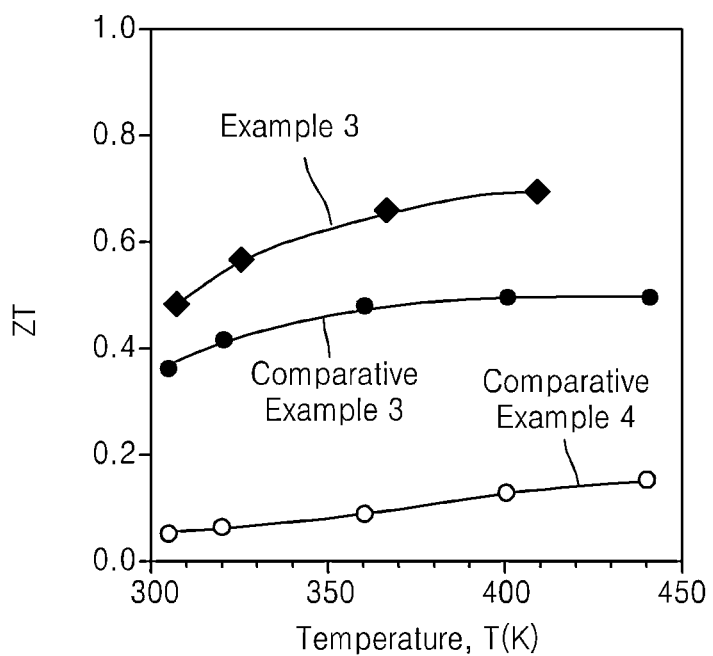
FIG. 7F is a graph of figure of merit (ZT) versus temperature (K) showing figures of merit of the thermoelectric materials prepared in Example 3, Comparative Example 3, and Comparative Example 4.

The results of the power factors and thermoelectric figures of merit (ZT) calculated from the results above are shown in FIGS. 7C and 7F, respectively.

As shown in FIGS. 7A to 7F, the thermoelectric material of Example 3 including the core/shell nanoplate showed a decrease in a lattice thermal conductivity and an increase in Seebeck coefficient compared to the thermoelectric materials of Comparative Example 3 and Comparative Example 4 including a simple nanoplate instead of the core/shell structure.

As a result, the figure of merit (ZT) of the thermoelectric material of Example 3 increased compared to those of the thermoelectric materials of Comparative Examples 3 and 4.

As described above, according to an aspect of the present disclosure, scattering of phonons increases by including a novel 2D nanostructure, and electronic carriers may be selectively transported to improve the figure of merit of the thermoelectric material.

It should be understood that the exemplary embodiments described herein should be considered in a descriptive sense only and not for purposes of limitation. Descriptions of features, advantages, or aspects within each embodiment should be considered as available for other similar features, advantages, or aspects in other embodiments.

What is claimed is:

1. A thermoelectric material comprising:
   a faceted two dimensional nanoplate, nanodisk or nanosheet having a core and a shell on the core, wherein the shell conforms to the core.

2. The thermoelectric material of claim 1, wherein the two dimensional nanostructure is in a form of a nanoplate.

3. The thermoelectric material of claim 1, wherein the two dimensional nanostructure has a shape of a circle, oval, triangle, rectangle, pentagon, or a hexagon.

4. The thermoelectric material of claim 1, wherein the two dimensional nanostructure has a diameter of about 10 nanometers to about 1000 nanometers.

5. The thermoelectric material of claim 1, wherein a thickness of the two dimensional nanostructure is about 1 nanometers to about 50 nanometers.

6. The thermoelectric material of claim 1, wherein a ratio of a thickness to a diameter of the two dimensional nanostructure is about 1:10 or greater.

7. The thermoelectric material of claim 1, wherein the two dimensional nanostructure has a ratio of a diameter of the core to a diameter of the shell of about 1:1.1 to about 1:3.

8. The thermoelectric material of claim 1, wherein the two dimensional nanostructure has a ratio of a thickness of the core to a thickness of the shell of about 1:1.1 to about 1:3.

9. The thermoelectric material of claim 1, wherein the core and the shell form an epitaxial junction in the two dimensional nanostructure.

10. The thermoelectric material of claim 1, wherein the two dimensional nanostructure comprises a semiconductor comprising an element of Group III to Group VI of the Periodic Table of Elements.

11. The thermoelectric material of claim 1, wherein the two dimensional nanostructure comprises a chalcogenide compound.

12. The thermoelectric material of claim 1, wherein the core and the shell of the two dimensional nanostructure each independently comprise at least one compound of Formulas 1 to 3, $Bi_{2-x}Te_{3-y}$ wherein $0 \leq x < 2, 0 \leq y < 3$,     Formula 1

$Bi_{2-x}Se_{3-y}$ wherein $0 \leq x < 2, 0 \leq y < 3$), or     Formula 2

$Bi_{2-x}Se_{3-y}Te_{3-z}$ wherein $0 \leq x < 2, 0 \leq y < 3, 0 \leq z < 3$).     Formula 3

13. The thermoelectric material of claim 1, further comprising a heterophase disposed between a core and a shell of the two dimensional nanostructure.

14. The thermoelectric material of claim 13, wherein the heterophase comprises a compound of Formula 3:

$Bi_{2-x}Se_{3-y}Te_{3-z}$ wherein $0 \leq x < 2, 0 \leq y < 3, 0 \leq z < 3$.     Formula 3

15. The thermoelectric material of claim 1 comprising a nanobulk comprising the two dimensional nanostructure.

16. A thermoelectric element comprising a thermoelectric material according to claim 1.

17. A thermoelectric module comprising:
a first electrode;
a second electrode; and
a thermoelectric element comprising the thermoelectric material of claim 1 disposed between the first electrode and the second electrode.

\* \* \* \* \*